United States Patent
Lee

(10) Patent No.: US 7,659,159 B2
(45) Date of Patent: Feb. 9, 2010

(54) METHOD OF MANUFACTURING A FLASH MEMORY DEVICE

(75) Inventor: Sung Hoon Lee, Seoul (KR)

(73) Assignee: Hynix Semiconductor Inc., Icheon-si (KR)

(*) Notice: Subject to any disclaimer, the term of this patent is extended or adjusted under 35 U.S.C. 154(b) by 0 days.

(21) Appl. No.: 11/753,363

(22) Filed: May 24, 2007

(65) Prior Publication Data
US 2008/0132016 A1 Jun. 5, 2008

(30) Foreign Application Priority Data
Dec. 4, 2006 (KR) .................. 10-2006-0121522

(51) Int. Cl.
H01L 21/8238 (2006.01)
(52) U.S. Cl. .............. 438/210; 438/433; 438/424; 438/425; 438/201; 438/257; 438/435; 438/721; 257/E21.548; 257/510; 257/374; 257/514; 257/515; 257/516; 257/519; 257/E21.545; 257/E21.546; 257/E21.564
(58) Field of Classification Search ............... 438/210
See application file for complete search history.

(56) References Cited

U.S. PATENT DOCUMENTS

| 5,719,085 | A  | * | 2/1998  | Moon et al. ............ 438/424 |
| 5,969,393 | A  | * | 10/1999 | Noguchi ................ 257/396 |
| 5,981,402 | A  | * | 11/1999 | Hsiao et al. ............ 438/756 |
| 6,037,018 | A  | * | 3/2000  | Jang et al. ............. 427/579 |
| 6,150,238 | A  | * | 11/2000 | Wu et al. .............. 438/435 |
| 6,251,735 | B1 | * | 6/2001  | Lou .................... 438/296 |
| 6,333,274 | B2 | * | 12/2001 | Akatsu et al. ........... 438/745 |
| 6,376,893 | B1 | * | 4/2002  | Rha .................... 257/522 |
| 6,465,325 | B2 | * | 10/2002 | Ridley et al. ........... 438/428 |
| 6,504,210 | B1 | * | 1/2003  | Divakaruni et al. ....... 257/344 |
| 6,531,377 | B2 | * | 3/2003  | Knorr et al. ............ 438/435 |
| 6,544,861 | B2 | * | 4/2003  | Joo .................... 438/424 |
| 6,566,229 | B2 | * | 5/2003  | Hong et al. ............. 438/435 |
| 6,653,204 | B1 | * | 11/2003 | Wu et al. .............. 438/435 |
| 6,667,223 | B2 | * | 12/2003 | Seitz .................. 438/427 |
| 6,693,050 | B1 | * | 2/2004  | Cui et al. .............. 438/782 |
| 6,720,611 | B2 | * | 4/2004  | Jang ................... 257/315 |

(Continued)

FOREIGN PATENT DOCUMENTS

JP       2005-332885       12/2005

(Continued)

Primary Examiner—Fernando L Toledo
Assistant Examiner—Ankush K Singal
(74) Attorney, Agent, or Firm—Townsend and Townsend and Crew LLP

(57) ABSTRACT

In a method of fabricating a flash memory device, a semiconductor substrate includes a tunnel insulating layer and a charge storage layer formed in an active region and a trench formed in an isolation region. A first insulating layer is formed to fill a part of the trench. A second insulating layer is formed on the first insulating layer so that the trench is filled. The first and second insulating layers are removed such that the first and second insulating layers remain on sidewalls of the charge storage layer and on a part of the trench. A third insulating layer is formed on the first and second insulating layers so that a space defined by the charge storage layer is filled. The third insulating layer is removed so that a height of the third insulating layer is lowered.

17 Claims, 4 Drawing Sheets

U.S. PATENT DOCUMENTS

| | | | | |
|---|---|---|---|---|
| 6,743,728 B2* | 6/2004 | Ho et al. | ...................... | 438/700 |
| 6,777,725 B2* | 8/2004 | Willer et al. | ................. | 257/244 |
| 6,780,728 B2* | 8/2004 | Tran | ............................ | 438/400 |
| 6,797,589 B2* | 9/2004 | Adams et al. | ............... | 438/426 |
| 6,798,038 B2* | 9/2004 | Sato et al. | ................... | 257/510 |
| 6,833,311 B2* | 12/2004 | Ho et al. | ...................... | 438/424 |
| 6,908,831 B2* | 6/2005 | O'Riain et al. | ............. | 438/435 |
| 6,939,780 B2* | 9/2005 | Yun et al. | ................... | 438/437 |
| 6,946,359 B2* | 9/2005 | Yang et al. | ................. | 438/425 |
| 7,033,945 B2* | 4/2006 | Byun et al. | ................. | 438/700 |
| 7,052,970 B2* | 5/2006 | Radecker | .................... | 438/435 |
| 7,056,792 B2* | 6/2006 | Lin | ............................. | 438/259 |
| 7,122,428 B2* | 10/2006 | Jung et al. | ................. | 438/257 |
| 7,151,295 B2* | 12/2006 | Yaegashi et al. | ............ | 257/316 |
| 7,163,863 B2* | 1/2007 | Shone | ......................... | 438/259 |
| 7,163,869 B2* | 1/2007 | Kim et al. | ................... | 438/424 |
| 7,166,539 B2* | 1/2007 | Fucsko et al. | ............... | 438/753 |
| 7,199,022 B2* | 4/2007 | Yasui et al. | ................. | 438/437 |
| 7,332,409 B2* | 2/2008 | Cha et al. | ................... | 438/435 |
| 7,364,975 B2* | 4/2008 | Culmsee et al. | ............ | 438/296 |
| 7,498,233 B2* | 3/2009 | Kim et al. | ................... | 438/437 |
| 2002/0058381 A1* | 5/2002 | Lee | ............................. | 438/259 |
| 2002/0072198 A1* | 6/2002 | Ahn | ............................ | 438/424 |
| 2002/0080659 A1 | 6/2002 | Shin et al. | | |
| 2002/0081817 A1* | 6/2002 | Bhakta et al. | ............... | 438/424 |
| 2002/0171118 A1* | 11/2002 | Mandelman et al. | ........ | 257/510 |
| 2003/0013271 A1* | 1/2003 | Knorr et al. | ................. | 438/435 |
| 2003/0087506 A1* | 5/2003 | Kirchhoff | ................... | 438/424 |
| 2003/0178669 A1* | 9/2003 | Kunori | ....................... | 257/314 |
| 2003/0235975 A1* | 12/2003 | Tran | ............................ | 438/598 |
| 2004/0043560 A1* | 3/2004 | Popp | .......................... | 438/243 |
| 2004/0058507 A1* | 3/2004 | Ho et al. | ...................... | 438/424 |
| 2004/0058549 A1* | 3/2004 | Ho et al. | ...................... | 438/694 |
| 2004/0126990 A1* | 7/2004 | Ohta | .......................... | 438/435 |
| 2004/0203217 A1* | 10/2004 | Lai et al. | ..................... | 438/435 |
| 2005/0116300 A1* | 6/2005 | Hieda et al. | ................. | 257/374 |
| 2005/0258463 A1* | 11/2005 | Yaegashi et al. | ............ | 257/296 |
| 2005/0266647 A1* | 12/2005 | Kim et al. | ................... | 438/296 |
| 2005/0287731 A1* | 12/2005 | Bian et al. | ................... | 438/201 |
| 2006/0011950 A1* | 1/2006 | Akasaka | ...................... | 257/243 |
| 2006/0073661 A1* | 4/2006 | Lee | ............................. | 438/296 |
| 2006/0094203 A1* | 5/2006 | Choi et al. | ................... | 438/424 |
| 2006/0246684 A1* | 11/2006 | Hoshi et al. | ................. | 438/427 |
| 2006/0264003 A1* | 11/2006 | Eun | ............................ | 438/424 |
| 2006/0270170 A1* | 11/2006 | Arisumi et al. | .............. | 438/296 |
| 2007/0063258 A1* | 3/2007 | Violette | ....................... | 257/315 |
| 2007/0087499 A1* | 4/2007 | Seo et al. | ..................... | 438/243 |
| 2007/0131987 A1* | 6/2007 | Kim | ............................ | 257/290 |
| 2007/0161233 A1* | 7/2007 | Seok | .......................... | 438/638 |
| 2007/0173005 A1* | 7/2007 | Lee | ............................. | 438/197 |
| 2007/0210403 A1* | 9/2007 | Sandhu | ....................... | 257/499 |
| 2007/0241373 A1* | 10/2007 | Kuroi et al. | .................. | 257/288 |
| 2007/0284650 A1* | 12/2007 | Willer | ......................... | 257/324 |
| 2008/0003739 A1* | 1/2008 | Lee et al. | ..................... | 438/221 |
| 2008/0003766 A1* | 1/2008 | Eun | ............................ | 438/396 |
| 2008/0003773 A1* | 1/2008 | Kwak et al. | ................. | 438/425 |
| 2008/0081411 A1* | 4/2008 | Cho et al. | ..................... | 438/257 |
| 2008/0102578 A1* | 5/2008 | Schlosser | .................... | 438/243 |
| 2008/0206976 A1* | 8/2008 | Kitamura et al. | ............ | 438/593 |

FOREIGN PATENT DOCUMENTS

| | | |
|---|---|---|
| JP | 2006-286720 | 10/2006 |
| KR | 1020040053441 A | 6/2004 |

* cited by examiner

METHOD OF MANUFACTURING A FLASH MEMORY DEVICE

CROSS-REFERENCES TO RELATED APPLICATIONS

The present application claims priority to Korean patent application number 10-2006-121522, filed on Dec. 4, 2006, which is incorporated by reference in its entirety.

BACKGROUND OF THE INVENTION

The present invention relates, in general, to flash memory devices and, more particularly, to a method of fabricating a flash memory device, which improves variation in Effective Field Height (EFH).

As memory devices become smaller in size, the surface area of a dielectric layer surrounding a floating gate changes. The surface area changes in relation to the degree that an isolation layer is recessed. The isolation layer is recessed to control the EFH of the isolation layer when the floating gate is formed by a Shallow Trench Isolation (STI) process during fabrication of the flash memory device that is 60 nm or less.

The EFH of the isolation layer varies widely because several processes are performed during fabrication that influence properties of the device. Example processes include a Chemical Mechanical Polishing (CMP) process for forming the isolation layer, a wet cleaning process for removing a hard mask layer, and a wet cleaning process for recessing the top surface of the isolation layer.

Variation in the surface area of the dielectric layer surrounding the floating gate causes variation in the coupling ratio between the floating gate and the control gate. Thus, fatal problems in device operation and performance often result. Example problems include variation in programming speed and interference due to increased capacitance, and a shift in the threshold voltage (Vt) due to cycling.

The EFH of the isolation layer is regulated to prevent damage to the low voltage region of the peri region during formation process of a gate. However, if the EFHs of the isolation layers in the cell region and the peri region are set to the same value, a loading phenomenon occurs due to a difference in the pattern size during an etch process for forming a STI profile of the low voltage region and the gate. Thus, damage occurs due to a difference in the amount in which the isolation layer is recessed. The damage occurs during the etch process when forming the gate.

During the STI etch process of the peri region, an etch target of a tunnel insulating layer depends on the thickness of a gate insulating layer formed in a high voltage region of the peri region, in which the thickness of the insulating layer is the largest. In the low voltage region where the thickness of the tunnel insulating layer is relatively small, the tunnel insulating layer is etched during the etch process of the tunnel insulating layer, and a semiconductor substrate is over-etched. Thus, top corners of a trench become sloped.

The slope profile at the top corners of the trench projects outwardly from the side of the floating gate. Thus, the top surface of the isolation layer is partially removed during the etch process for forming the gate. Consequently, damage occurs due to the removed isolation layer.

SUMMARY OF THE INVENTION

Accordingly, the present invention addresses the above problems, and discloses a method of fabricating a flash memory device, which improves variation in programming speed, variation in interference due to increased capacitance, and a shift in the threshold voltage (Vt) due to cycling, by improving the variation in the EFH of an isolation layer.

According to an aspect of the present invention, a method of fabricating a flash memory device includes providing a semiconductor substrate in which a tunnel insulating layer and a charge storage layer are formed in an active region and a trench is formed in an isolation region. A first insulating layer is formed to fill a part of the trench. A second insulating layer is formed over the first insulating layer so that the trench is filled. The first and second insulating layers are removed so that the first and second insulating layers remain on sidewalls of the charge storage layer and on a part of the trench. A third insulating layer is formed over the first and second insulating layers so that a space defined by the charge storage layer is filled. The third insulating layer is removed so that a height of the third insulating layer is lowered.

DESCRIPTION OF SPECIFIC EMBODIMENTS

A specific embodiment according to the present patent will be described with reference to the accompanying drawings.

FIGS. 1A to 1H are cross-sectional view illustrating a method of fabricating a flash memory device according to the present invention. The present invention improves variation in the EFH of an isolation layer, which occurs in a cell region. It is to be noted that although the present invention is described with reference to the cell region, the same process steps can be applied to a peri region.

Figure 1A:
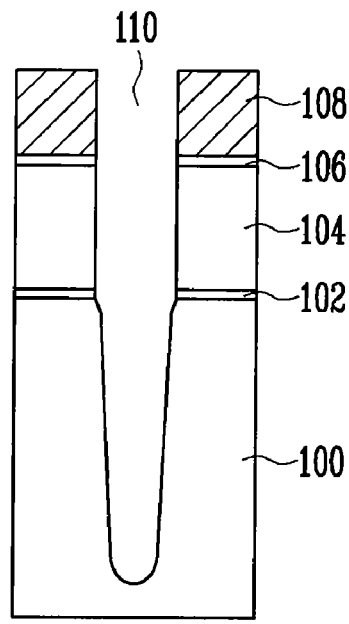
FIGS. 1A to 1H are cross-sectional view illustrating a method of fabricating a flash memory device according to the present invention.

Referring to FIG. 1A, a tunnel insulating layer 102 and a first conductive layer 104 for a floating gate are sequentially formed over a semiconductor substrate 100. The tunnel insulating layer 102 can be formed of oxide and the first conductive layer 104 can be formed of a polysilicon layer. A hard mask layer is formed on the first conductive layer 104. The hard mask layer has a stack structure of a buffer insulating layer 106 and a first insulating layer 108. The buffer insulating layer 106 can be formed of oxide and the first insulating layer 108 can be formed of nitride. The hard mask layer, the first conductive layer 104, the tunnel insulating layer 102 and a part of the semiconductor substrate 100 are etched by photo and development processes, thereby forming an isolation trench 110.

Figure 1B:
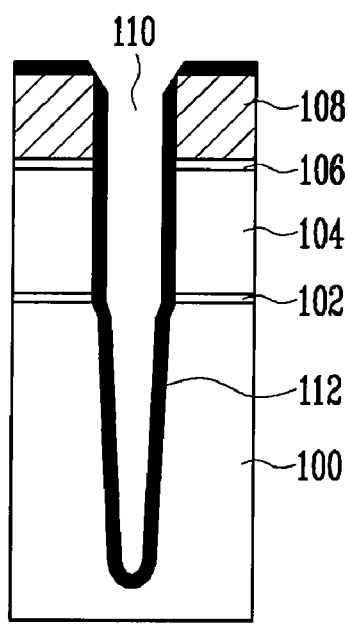

Referring to FIG. 1B, a sidewall insulating layer 112 is formed on the surface of the semiconductor substrate 100, including the trench 110. The sidewall insulating layer 112 can be formed at a thickness of approximately 30 to approximately 100 angstroms by a thermal oxidization process.

Figure 1C:
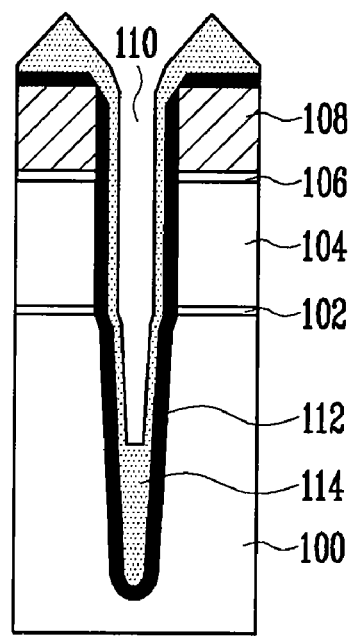

Referring to FIG. 1C, a second insulating layer 114 is formed on the surface of the sidewall insulating layer 112. The second insulating layer 114 can be formed using a High Density Plasma (HDP) oxide layer. The second insulating layer 114 can be formed at a thickness of approximately 30 to approximately 200 angstroms on the sidewalls of the trench 110 and can be formed at a thickness of approximately 300 to approximately 2000 angstroms on the lower region of the trench 110.

Figure 1D:
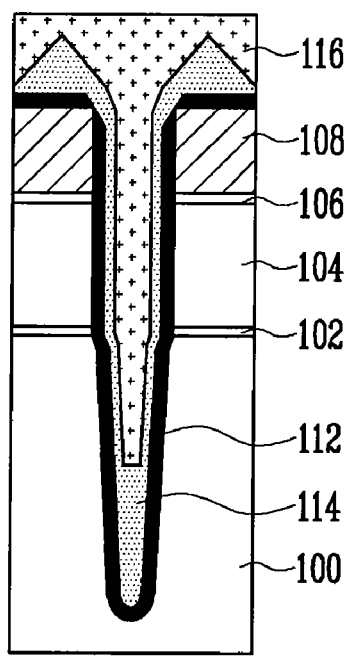

Referring to FIG. 1D, a third insulating layer 116 is formed over the semiconductor substrate 100 including the trench 110 so that the trench 110 is filled. The third insulating layer 116 can be formed of Spin On Glass (SOG)-based oxide.

Figure 1E:
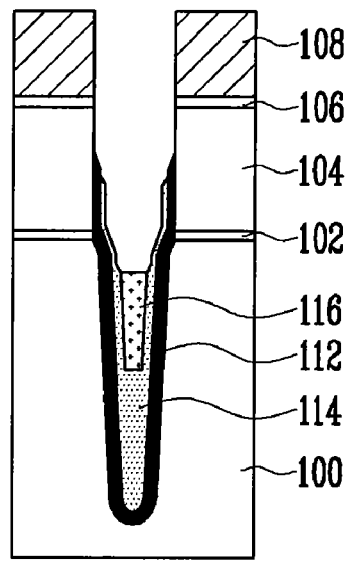

Referring to FIG. 1E, a Chemical Mechanical Polishing (CMP) process is performed until the top surface of the hard mask layer is exposed, thereby removing the third insulating layer 116, the second insulating layer 114 and the sidewall insulating layer 112. The third insulating layer 116 remaining within the trench 110 is removed by means of a wet cleaning process. The third insulating layer 116 is removed using a HF-based solution, but remains at a thickness of approximately 200 to approximately 1000 angstroms under the tunnel insulating layer 102.

During the removal process of the third insulating layer 116, the sidewall insulating layer 112 and the second insulating layer 114 at the top and sides of the trench 110 are also removed, so that the sidewall insulating layer 112 and the second insulating layer 114 remain on the sides of the first conductive layer 104 at a specific height. During the wet cleaning process, the etch rate of the second insulating layer 114 is faster than the etch rate of the sidewall insulating layer 112, and the etch rate of the third insulating layer 116 is faster than the etch rate of the second insulating layer 114.

Figure 1F:
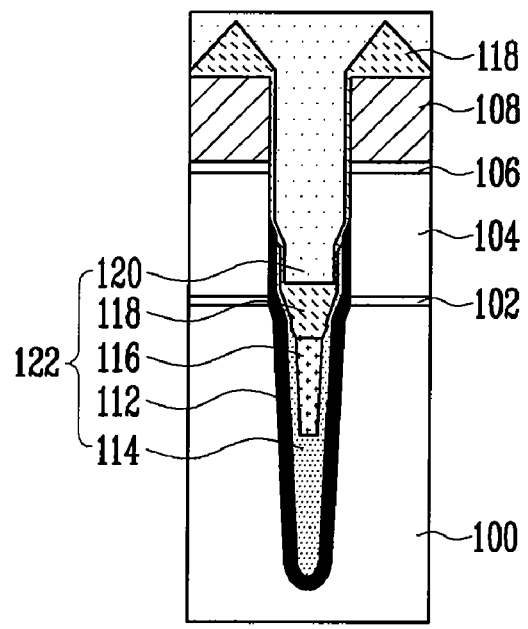

Referring to FIG. 1F, a fourth insulating layer 118 is formed on the surface of the trench 110. The fourth insulating layer 118 can be formed of a HDP oxide layer. The fourth insulating layer 118 can be formed at a thickness of approximately 30 to approximately 200 angstroms on the sidewalls of the trench 110 and can be formed at a thickness of approximately 300 to approximately 2000 angstroms on the lower region of the trench 110 from the top of the third insulating layer 116.

A fifth insulating layer 120 is formed over the semiconductor substrate 100 including the trench 110 so that the trench 110 is filled. The fifth insulating layer 120 can be formed of SOG-based oxide.

Figure 1G:
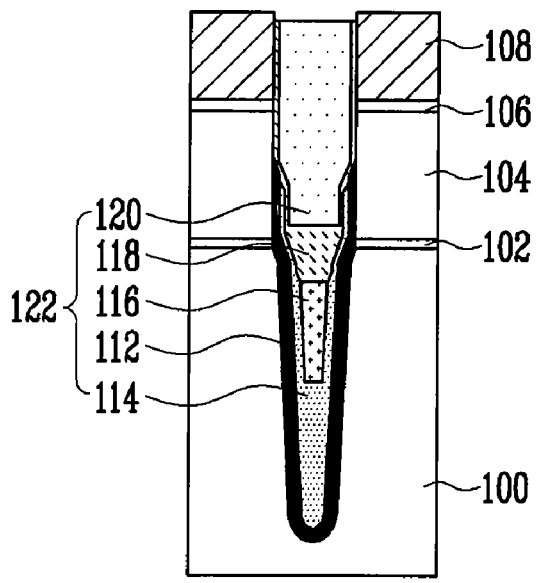

Referring to FIG. 1G, a CMP process is performed until the top surface of the hard mask layer is exposed, thereby removing the fifth insulating layer 120 and the fourth insulating layer 118 and forming an isolation layer 122. As the isolation layer 122 is formed, an active region and an isolation region are defined.

Figure 1H:
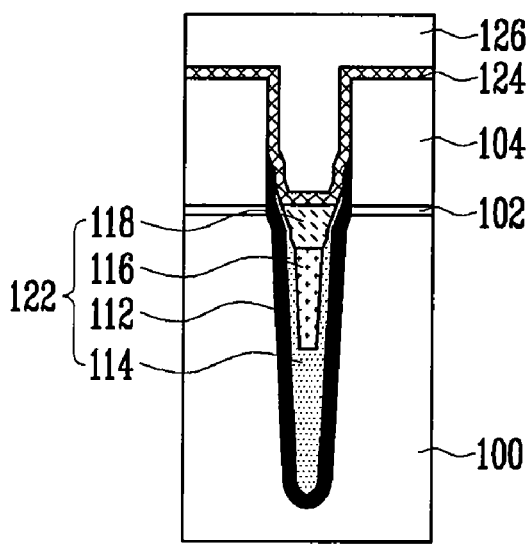

Referring to FIG. 1H, a photoresist pattern is formed over the semiconductor substrate 100. The photoresist pattern exposes the cell region and covers the peri region. The fifth insulating layer 120 and the fourth insulating layer 118, which fill the trench 110 of the cell region, are partially removed by a wet cleaning process to regulate the EFH of the isolation layer 122.

The fifth insulating layer 120 and the fourth insulating layer 118 are removed using a HF-based solution. Application of the HF-based solution is controlled such that the heights of the sidewall insulating layer 112, the second insulating layer 114 and the fourth insulating layer 118 formed on the sides of the first conductive layer 104 are larger than the height of the isolation layer 122. By regulating the heights of the sidewall insulating layer 112, the second insulating layer 114 and the fourth insulating layer 118 formed on the sides of the first conductive layer 104 to be larger than the height of the isolation layer 122, the active region is not damaged.

During the wet cleaning process, the etch rate of the fifth insulating layer 120 is faster than the etch rate of the fourth insulating layer 118. During the removal process of the fifth insulating layer 120 and the fourth insulating layer 118, the hard mask layer is also removed. Accordingly, the EFHs of each of the isolation layer 122s of the cell region and the peri region are different.

The photoresist pattern formed in the peri region is removed. A dielectric layer 124 and a second conductive layer 126 for a control gate are formed over the semiconductor substrate 100 including the first conductive layer 104 and the isolation layer 122. The second conductive layer 126 can be formed of a polysilicon layer.

As described above, variation in the EFH of the isolation layer 122 can be improved by regulating the EFH of the isolation layer 122 by the wet cleaning process. By improving variation in the EFH of the isolation layer 122, variation in programming speed, variation in the interference due to increased capacitance, and a shift in the threshold voltage (Vt) due to cycling can be improved.

The heights of the sidewall insulating layer 112 and the second and fourth insulating layers 114 and 118, which remain on the sides of the first conductive layer 104, are regulated to be constant and to be larger than the height of the isolation layer 122. Thus, the active region is not damaged. Furthermore, the contact area of the floating gate 104 and the dielectric layer 124 become constant. Accordingly, the coupling ratio is a constant value.

As described above, the present invention has the following advantages.

First, by regulating the EFH of the isolation layer using a wet cleaning process, variation in the EFH of the isolation layer can be improved.

Second, by improving variation in the EFH of the isolation layer, variation in the programming speed, variation in the interference due to increased capacitance, and a shift in the threshold voltage (Vt) due to cycling can be improved.

Third, by regulating the heights of the sidewall insulating layer and the second and fourth insulating layers, which remain on the sides of the first conductive layer, to be constant and to be larger than the height of the isolation layer, the active region is not damaged, and the contact area of the floating gate and the dielectric layer becomes constant.

Fourth, the constant value of the contact area of the floating gate and the dielectric layer causes the coupling ratio to be a constant value.

Although the foregoing description has been made with reference to a specific embodiment, it is to be understood that changes and modifications of the present patent may be made by one having ordinary skill in the art without departing from the spirit and scope of the present patent and appended claims.

What is claimed is:

1. A method of fabricating a flash memory device, the method comprising:

providing a semiconductor substrate in which a tunnel insulating layer and a first conductive layer are stacked on an active region and a trench is formed in an isolation region;

forming a first insulating layer on a surface of the trench and on a surface of the first conductive layer;

forming a second insulating layer over the first insulating layer so that the trench is filled;

removing portions of the first and second insulating layers to expose a first portion of the sidewalls of the first conductive layer, the first insulating layer and the second insulating layer remaining on the sidewalls of the trench and on a second portion of the sidewalls of the first conductive layer, wherein a height of the second insulating layer is lower than a height of the first insulating layer remaining on the second portion of the sidewalls of the first conductive layer;

forming a third insulating layer over the first and second insulating layers so that a space defined by the first conductive layer is filled, wherein the third insulating layer contacts the first insulating layer remaining on the second portion of the sidewalls of the first conductive layer;

removing a portion of the third insulating layer so that a height of the third insulating layer is lowered and a portion of the first insulating layer remains on the second portion of the sidewalls of the first conductive layer; and forming a dielectric layer and a second conductive layer for a control gate over the semiconductor substrate including the first conductive layer.

2. The method of claim 1, further comprising performing a thermal oxidization process to oxidize the sidewalls and a bottom of the trench before the first insulating layer is formed.

3. The method of claim 1, wherein the first insulating layer is formed using a High Density Plasma (HDP) oxide layer.

4. The method of claim 1, wherein the first insulating layer is formed at a thickness of approximately 30 to approximately 200 angstroms on the sidewalls of the trench and is formed at a thickness of approximately 300 to approximately 2000 angstroms on a lower region of the trench.

5. The method of claim 1, wherein the second insulating layer is formed of Spin On Glass (SOG)-based oxide.

6. The method of claim 1, wherein the first insulating layer and the second insulating layer are removed by a wet cleaning process.

7. The method of claim 1, wherein the second insulating layer has a thickness of approximately 200 to approximately 1000 angstroms under the tunnel insulating layer.

8. The method of claim 1, wherein the third insulating layer has a stack structure of a HDP oxide layer and a SOG-based oxide.

9. The method of claim 1, wherein when removing the third insulating layer, the third insulating layer within the trench of a cell region is removed.

10. The method of claim 1, wherein the third insulating layer has a stack structure of a HDP oxide layer and a SOG-based oxide, the third insulating layer being removed by a wet cleaning process.

11. The method of claim 1, wherein the third insulating layer is removed using a HF-based solution.

12. The method of claim 1, wherein an Effective Field Height (EFH) of an isolation layer is regulated by removing the third insulating layer.

13. The method of claim 2, wherein during the thermal oxidization process, an oxide layer is formed at a thickness of approximately 30 to approximately 100 angstroms.

14. The method of claim 6, wherein during the wet cleaning process, the first insulating layer and the second insulating layer are removed using a HF-based solution.

15. The method of claim 6, wherein during the wet cleaning process, an etch rate of the second insulating layer is faster than an etch rate of the first insulating layer.

16. The method of claim 8, wherein the HDP oxide layer is formed at a thickness of approximately 30 to approximately 200 angstroms on the sidewalls of the trench and is formed at a thickness of approximately 300 to approximately 2000 angstroms on a lower region of the trench from a top of the second insulating layer.

17. The method of claim 10, wherein during the wet cleaning process, an etch rate of the SOG-based oxide is faster than an etch rate of the HDP oxide layer.

* * * * *